(12) United States Patent
Hughes et al.

(10) Patent No.: US 8,174,166 B1
(45) Date of Patent: May 8, 2012

(54) UNIFORMLY DISTRIBUTED LEAD ZIRCONATE TITANATE STRAIN SENSOR

(75) Inventors: Derke R. Hughes, Warwick, RI (US); Dennis F. Desharnais, Tiverton, RI (US); Jeffrey T. Feaster, Wakefield, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 212 days.

(21) Appl. No.: 12/714,629

(22) Filed: Mar. 1, 2010

(51) Int. Cl.
*H01L 41/09* (2006.01)
(52) U.S. Cl. ......................... 310/338; 310/369
(58) Field of Classification Search .................. 310/338, 310/369
See application file for complete search history.

(56) References Cited

U.S. PATENT DOCUMENTS

| | | | | | |
|---|---|---|---|---|---|
| 3,531,989 | A | * | 10/1970 | Wood | 374/29 |
| 4,050,313 | A | * | 9/1977 | Shimada et al. | 73/727 |
| 4,173,900 | A | * | 11/1979 | Tanabe et al. | 73/727 |
| 2006/0195035 | A1 | * | 8/2006 | Sun | 600/503 |
| 2007/0247028 | A1 | * | 10/2007 | Brosch et al. | 310/338 |

FOREIGN PATENT DOCUMENTS

JP  06-174509  * 6/1994

* cited by examiner

*Primary Examiner* — Thomas Dougherty
(74) *Attorney, Agent, or Firm* — James M. Kasischke; Jean-Paul A. Nasser; Michael P. Stanley

(57) ABSTRACT

The invention as disclosed is a strain sensor that locates and quantifies the strain energy from a structure. The strain sensor has a lead zirconate titanate wafer with a circular shape such that the shape does not directionally restrict the signal of the sensor.

1 Claim, 3 Drawing Sheets

UNIFORMLY DISTRIBUTED LEAD ZIRCONATE TITANATE STRAIN SENSOR

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER PATENT APPLICATIONS

None.

BACKGROUND OF THE INVENTION (1) Field of the Invention

The present invention is directed to strain sensors. In particular, the present invention is directed to a uniform lead zirconate titanate sensor that locates and quantifies the strain energy from a structure.

(2) Description of the Prior Art

Currently, technology is being pursued that will aid the development of artificially intelligent structures or devices. These structures or devices that are considered intelligent are capable of detecting and recording parameters associated with their environment by assessing physical properties such as temperature, pressure, humidity, seismic and mechanical vibration, and optical imaging. Once the physical parameters are detected, a given algorithm within the sensor interprets the measured parameters of the surroundings and the structure or device responds to the stimulus as programmed.

One application for the use of artificially intelligent structures is to develop boat and ship hulls with such capabilities. For example, hull array technology is the concept of producing submarines with hulls containing integrated sensors that can passively investigate the submarine's surroundings. The integrated hull array sensors detect acoustic energy found within a body of water in which the submarine is traveling. The received signals can alert the submarine to impending dangers such as torpedoes, land mines, or other submarines. Non-threatening acoustic emissions are also present in an open-sea environment generated by marine life. The interpretation of the measured signals by the sensors allows the vessel to listen to its surroundings in multiple directions and distinguish between various acoustic emissions.

To accomplish integrated hull array technology, what is needed is a uniform lead zirconate titanate sensor that locates and quantifies the strain energy from a structure, and is capable of being embedded into a composite material. A standard lead zirconate titanate sensor has a directional dependence on the strain measurement as a result of the rectangular shape of the lead zirconate titanate wafer portion of the sensor. What is needed is a uniform lead zirconate titanate sensor that is not directionally dependent, because the lead zirconate titanate wafer has a constant radius. The constant radius creates a uniform strain despite the direction of the wave front contact point on the lead zirconate titanate sensor. Therefore a uniform lead zirconate titanate wafer unlike a rectangular one registers the same voltage reading regardless of the path of the strain wave.

SUMMARY OF THE INVENTION

It is a general purpose and object of the present invention to present a design for a uniform lead zirconate titanate sensor that is not directionally dependant because it has a constant radius.

The above object is accomplished with the present invention through the use of a strain sensor that locates and quantifies the strain energy from a structure. The strain sensor has a lead zirconate titanate wafer with a circular shape such that the shape does not directionally restrict the signal of the sensor.

BRIEF DESCRIPTION OF THE DRAWINGS

A more complete understanding of the invention and many of the attendant advantages thereto will be more readily appreciated by referring to the following detailed description when considered in conjunction with the accompanying drawings, wherein like reference numerals refer to like parts and wherein.

DETAILED DESCRIPTION OF THE INVENTION

Figure 1A:
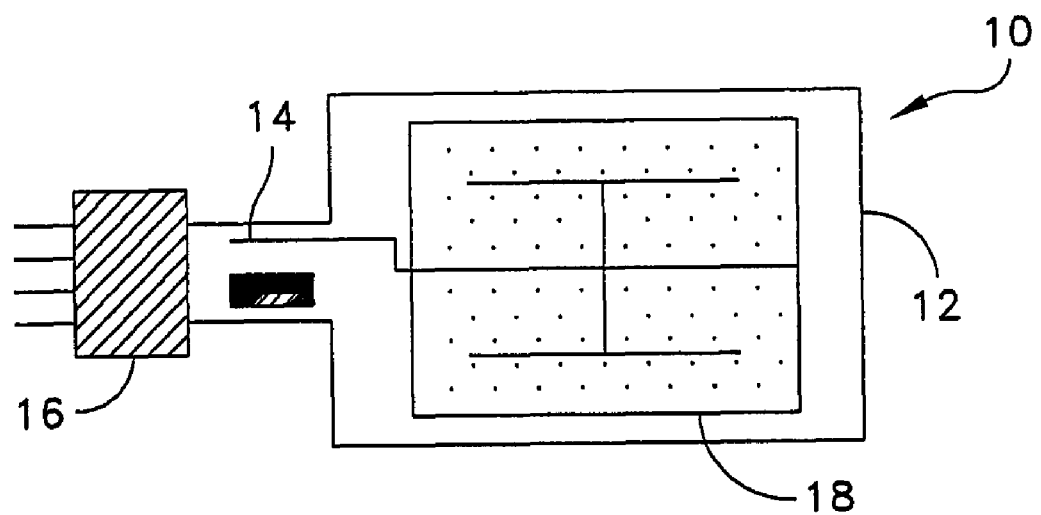
FIG. 1a shows a prior art standard lead zirconate titanate strain sensor.
Figure 1B:
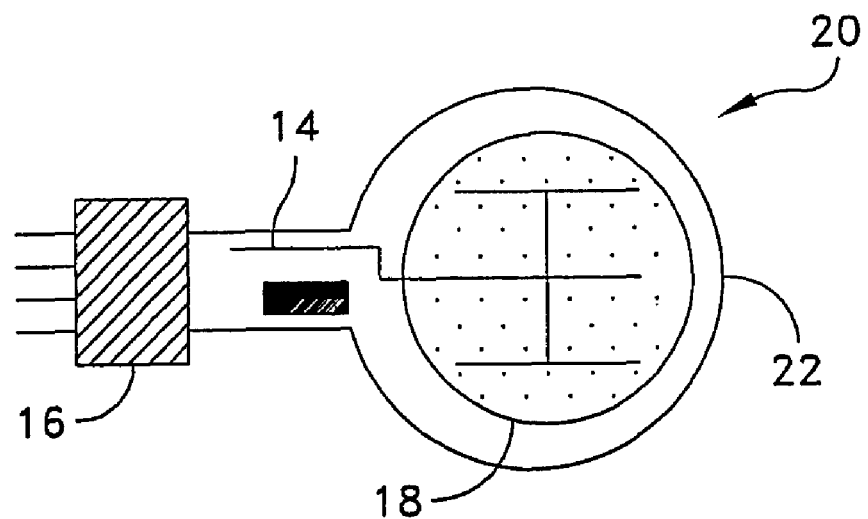
FIG. 1b shows a uniform lead zirconate titanate strain sensor of the present invention.

A standard prior art strain sensor 10 such as the one illustrated in FIG. 1a operates in the following manner: a piezoelectric material deflects a wave front and creates a voltage difference between the top and bottom portion of the piezoelectric wafer. In a preferred embodiment, the piezo-electric material is a composite wafer 12 of lead zirconate and titanate. The lead zirconate titanate wafer is rectangular in shape. Disposed over the surface of the lead zirconate titanate wafer are wire traces 14 capable of carrying an electric current. The wire traces carry the voltage out of the lead zirconate titanate wafer and into a pin connector 16 joined to the end of the wafer. The lead zirconate titanate wafer 12 and wire traces 14 are covered with polyimide film 18 that serves as an overall protective layer to prevent corrosion and contamination. The voltage generated by the sensor 10 can be measured by any standard data acquisition system.

The strain sensor design of the present invention 20 is one with a circular piezo-electric wafer 22 portion having a constant radius thereby making it uniform. In a preferred embodiment, the piezo-electric wafer 22 is a composite of lead zirconate and titanate. Disposed over the surface of the lead zirconate titanate wafer are wire traces 14 capable of carrying an electric current. The wire traces carry the voltage out of the lead zirconate titanate wafer and into a pin connector 16 joined to the end of the wafer. The lead zirconate titanate wafer 22 and wire traces 14 are covered with polyimide film 18 that serves as an overall protective layer to prevent corrosion and contamination. The voltage generated by the sensor 20 can be measured by any standard data acquisition system. The circular shape of the piezo-electric wafer 22 does not directionally restrict a signal of the sensor 20. The constant radius creates a uniform strain despite the direction of the wave front contact point on the lead zirconate titanate sensor 20. Therefore a uniform lead zirconate titanate wafer 22 unlike a prior art rectangular one 12 registers the same voltage reading regardless of the path of the strain wave.

Figure 2:
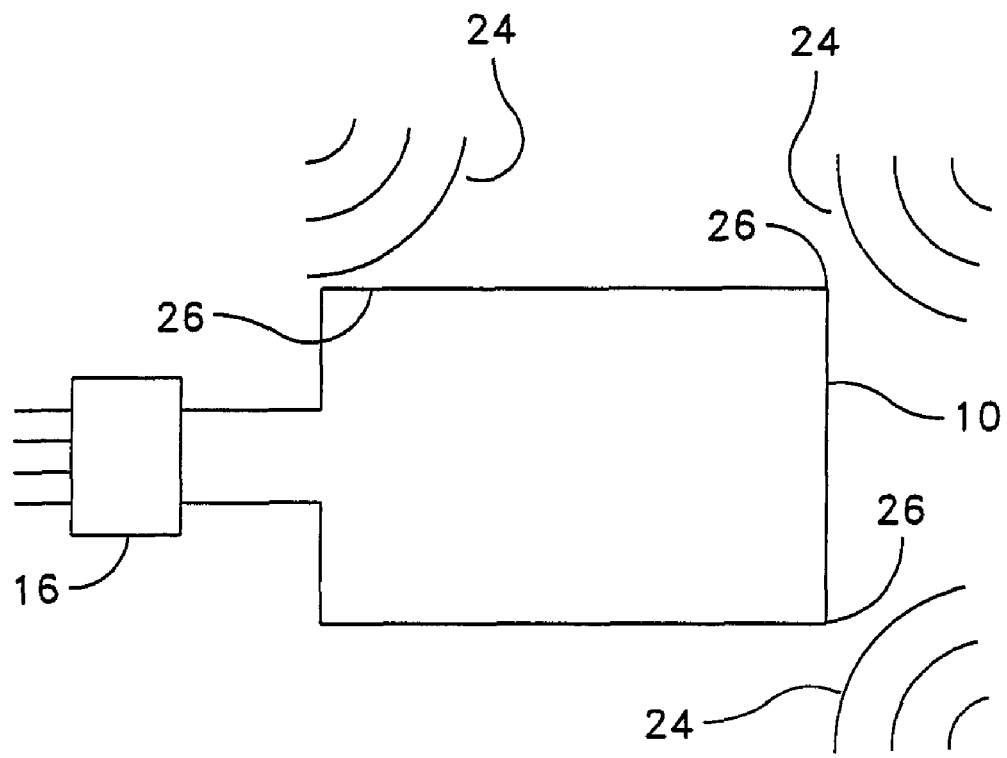
FIG. 2 illustrates an aspect ratio inherent in rectangular sensors.
Figure 2:
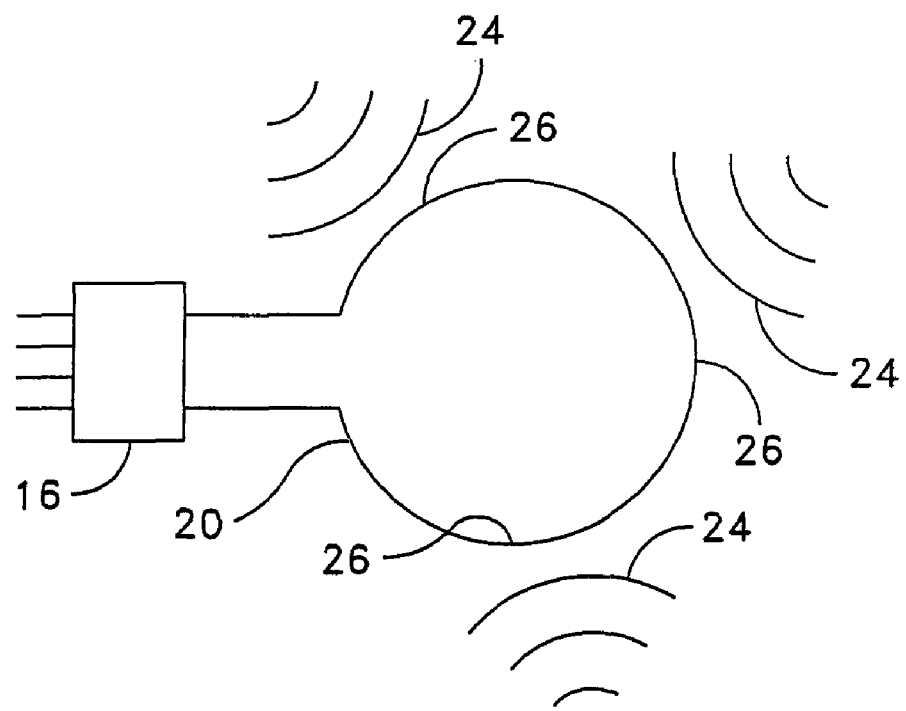

Referring to FIG. 2, there is illustrated several features of the uniform distributed lead zirconate titanate strain sensor 20 that are new and innovative. These features attest to the advantages of the design. For example, the standard prior art strain sensor 10 that is directionally dependent generates a signal that is more difficult to process due to the direction of the wave front 24 contact. The point of contact 26 can create errors in both time of arrival and amplitude, because the leading edge of the signal is critical in deducing these parameters. The uniform distributed lead zirconate titanate strain sensor 20 of the present invention does not directionally restrict the signal. Rather than having varying strain at the various contact points 26 with wave fronts 24 that a standard rectangular strain sensor 10 has due to its inherent aspect ratio, the errors associated with a uniform strain sensor 20 are constant due to its constant radius.

Figure 3:
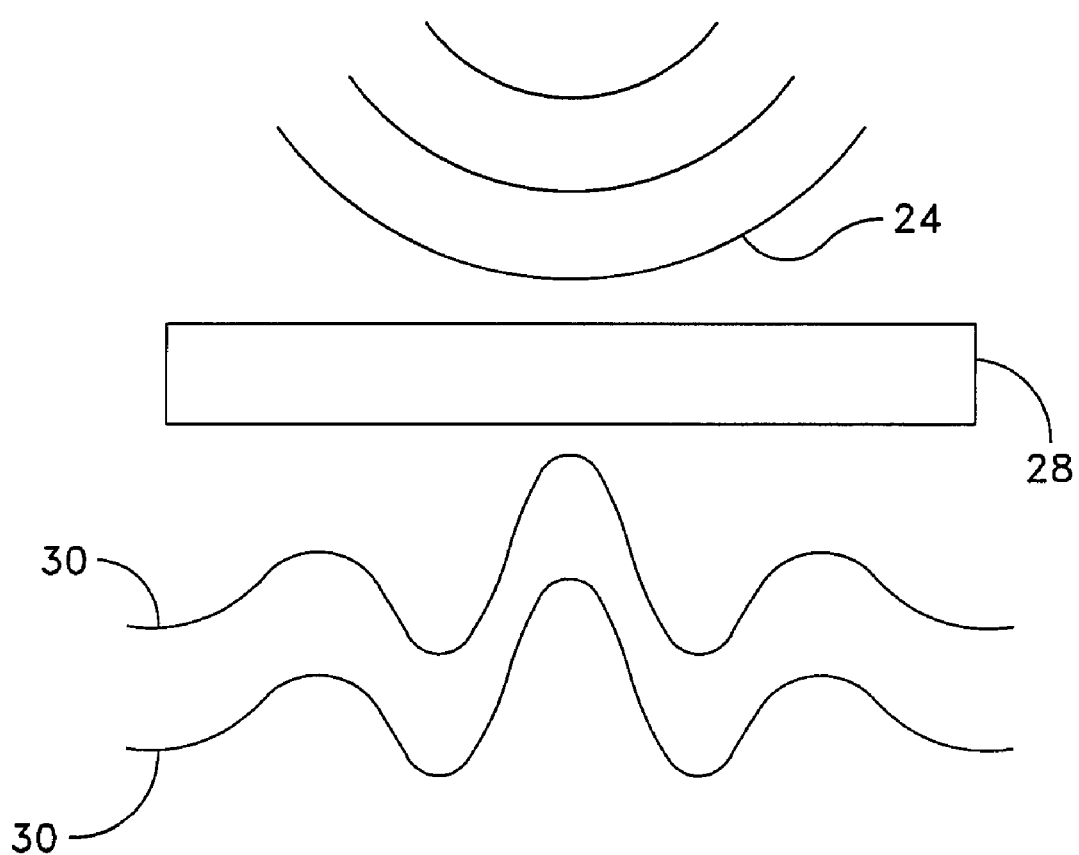
FIG. 3 depicts averaging higher order strain waves.

Referring to FIG. 3 there is illustrated a lead zirconate titanate wafer 28 with wave fronts 24 impinging on the surface and the strain wave energy 30 generated by the wave fronts. The higher frequency signals are more susceptible to averaging out the strain wave energy experienced by the lead zirconate titanate wafer.

The advantage of the present invention is that it will retain the structural ruggedness, thermal properties and thin design of prior art lead zirconate titanate sensors while not being directionally dependant because it has a constant radius.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s). Therefore, it will be understood that the appended claims are intended to cover all such modifications and embodiments, which would come within the spirit and scope of the present invention.

What is claimed is:

1. A strain sensor comprising:
   a piezo-electric wafer made of lead, zirconate and titanate wherein said piezo-electric wafer has a circular shape with a constant radius thereby making the piezo-electric wafer uniform;
   a plurality of wire traces disposed over the surface of the piezo-electric wafer, wherein said pluralities of wire traces are capable of carrying an electric current;
   a pin connector joined to the piezo-electric wafer and connected to said plurality of wire traces, wherein the plurality of wire traces carry a voltage out of the piezo-electric wafer and into said pin connector; and
   a polyimide film disposed over the piezo-electric wafer and the plurality of wire traces such that said polyimide film serves as an overall protective layer to prevent corrosion and contamination of the piezo-electric wafer and the plurality of wire traces.

\* \* \* \* \*